(12) United States Patent
Hudait et al.

(10) Patent No.: US 7,851,780 B2
(45) Date of Patent: *Dec. 14, 2010

(54) SEMICONDUCTOR BUFFER ARCHITECTURE FOR III-V DEVICES ON SILICON SUBSTRATES

(75) Inventors: Mantu K. Hudait, Portland, OR (US); Mohamad A. Shaheen, Portland, OR (US); Dmitri Loubychev, Behtlethem, PA (US); Amy W. K. Liu, Mountain View, CA (US); Joel M. Fastenau, Bethlehem, PA (US)

(73) Assignee: Intel Corporation, Santa Clara, CA (US)

( * ) Notice: Subject to any disclaimer, the term of this patent is extended or adjusted under 35 U.S.C. 154(b) by 1167 days.

This patent is subject to a terminal disclaimer.

(21) Appl. No.: 11/498,685

(22) Filed: Aug. 2, 2006

(65) Prior Publication Data

US 2008/0029756 A1    Feb. 7, 2008

(51) Int. Cl.
*H01L 29/12* (2006.01)

(52) U.S. Cl. .......................... 257/14; 257/190; 257/192; 257/E49.003; 257/E29.069; 257/E29.248

(58) Field of Classification Search ................... 257/14, 257/190, 192, 194, E49.003, E29.246, E29.248, 257/E29.252, E29.069

See application file for complete search history.

(56) References Cited

U.S. PATENT DOCUMENTS

| | | | |
|---|---|---|---|
| 4,872,046 A | | 10/1989 | Morkoc et al. |
| 5,144,378 A | * | 9/1992 | Hikosaka ............... 257/194 |
| 5,495,115 A | * | 2/1996 | Kudo et al. ............ 257/190 |
| 5,883,564 A | | 3/1999 | Partin |
| 5,981,400 A | | 11/1999 | Lo |
| 6,117,697 A | | 9/2000 | Seaford et al. |

(Continued)

FOREIGN PATENT DOCUMENTS

JP     2005-085916 A     3/2005

(Continued)

OTHER PUBLICATIONS

Nguyen et al., Growth of heteroepitaxial GaSb thn films on Si(100) substrates, Journal of Materials Research, vol. 19, No. 8, Aug. 2004, pp. 2315-2321.*

(Continued)

*Primary Examiner*—David Vu
*Assistant Examiner*—Earl N Taylor
(74) *Attorney, Agent, or Firm*—Blackely, Sokoloff, Taylor & Zafman LLP

(57) ABSTRACT

A composite buffer architecture for forming a III-V device layer on a silicon substrate and the method of manufacture is described. Embodiments of the present invention enable III-V InSb device layers with defect densities below $1 \times 10^8$ $cm^{-2}$ to be formed on silicon substrates. In an embodiment of the present invention, a dual buffer layer is positioned between a III-V device layer and a silicon substrate to glide dislocations and provide electrical isolation. In an embodiment of the present invention, the material of each buffer layer is selected on the basis of lattice constant, band gap, and melting point to prevent many lattice defects from propagating out of the buffer into the III-V device layer. In a specific embodiment, a GaSb/AlSb buffer is utilized to form an InSb-based quantum well transistor on a silicon substrate.

12 Claims, 10 Drawing Sheets

U.S. PATENT DOCUMENTS

| | | | |
|---|---|---|---|
| 6,133,593 | A | 10/2000 | Boos et al. |
| 6,320,212 | B1 | 11/2001 | Chow |
| 6,406,795 | B1 | 6/2002 | Hwang |
| 2002/0093332 | A1* | 7/2002 | Schroeder et al. ........... 324/251 |
| 2005/0040429 | A1 | 2/2005 | Uppal |

OTHER PUBLICATIONS

Uchida et al., Reduction of dislocation density by thermal annealing for GaAs/GaSb/Si heterostructure, Journal of Crystal Growth, 150, 1995, pp. 681-684.*

Balakrishnan et al., Room-temperature optically-pumped GaSb quantum well based VCSEL monolithically grown on Si (100) substrate, Electronic Letters, vol. 42, No. 6, Mar. 16, 2006, two pages.*

M Mori et al., Heteroepitaxial growth of InSb films on a Si(001) substrate via AlSb buffer layer, Applied Surface Science 216 (2003) pp. 569-574.

A. Wan et al., Characterization of GaAs grown by Molecular Beam Epitaxy on Vicinal Ge (100) Substrates. J. Vac. Sci. Technol. B 22(4) Jul./Aug. 2004, pp. 1893-1897.

R.M. Sieg et al., Toward device-quality GaAs Growth by Molecular Beam Epitaxy on Offcut Ge/SiGe/Si substrates, J. Vac. Sci. Technol. B 16(3), May/Jun. 1998, pp. 1471-1474.

S. Scholz et al., MOVPE Growth of GaAs on Ge Substrates by Inserting a Thin Low Temperature Buffer Layer, Cryst. Res. Technol. 41, No. 2 (2006), pp. 111-116.

M. Doczy et al., US Patent Application, Extreme High Mobility CMOS Logic, U.S. Appl. No. 11/305,452, Dec. 15, 2005.

Office Action for U.S. Appl. No. 11/501,253, mailed May 14, 2008, whole document.

Office Action for U.S. Appl. No. 11/501,253, mailed Dec. 12, 2008, whole document.

Notice of Allowance for U.S. Appl. No. 11/501,253, mailed Apr. 7, 2009, whole document.

Office Action for U.S. Appl. No. 11/498,901, mailed Aug. 1, 2008, whole document.

Final Office Action for U.S. Appl. No. 11/498,901, mailed Nov. 17, 2008, whole document.

Office Action for U.S. Appl. No. 11/498,901, mailed Jun. 8, 2009, whole document.

Final Office Action for U.S. Appl. No. 11/498,901, mailed Dec. 17, 2009, whole document.

* cited by examiner

SEMICONDUCTOR BUFFER ARCHITECTURE FOR III-V DEVICES ON SILICON SUBSTRATES

BACKGROUND OF THE INVENTION

1. Field of the Invention

The present invention relates to integrating III-V semiconductor devices upon silicon substrates. More particularly this invention relates to the buffer layer between a III-V semiconductor device and a silicon substrate.

2. Discussion of Related Art

A variety of electronic and optoelectronic devices can be enabled by developing thin film relaxed lattice constant III-V semiconductors on elemental silicon (Si) substrates. Surface layers capable of achieving the performance advantages of III-V materials may host a variety of high performance electronic devices such as CMOS and quantum well (QW) transistors fabricated from extreme high mobility materials such as, but not limited to, indium antimonide (InSb) and indium arsenide (InAs). Optical devices such as lasers, detectors and photovoltaics may also fabricated from various other direct band gap materials, such as, but not limited to, gallium arsenide (GaAs) and indium gallium arsenide (InGaAs). These devices can be further enhanced by monolithically integrating them with conventional devices of silicon and use of a silicon substrate has the additional advantage of cost reduction.

Despite all these advantages, the growth of III-V materials upon silicon substrates presents many challenges. Crystal defects are generated by lattice mismatch, polar-on-nonpolar mismatch and thermal mismatch between the III-V semiconductor epitaxial layer and the silicon semiconductor substrate. When the lattice mismatch between the epitaxial layer and substrate exceeds a few percent, the strain induced by the mismatch becomes too great and defects are generated in the epitaxial layer when the epitaxial film relaxes. Once the film thickness is greater than the critical thickness (film is strained below this thickness and relaxed above this thickness), the strain is relaxed by creating misfit dislocations at the film and substrate interface as well as in the epitaxial film. The epitaxial crystal defects are typically in the form of threading dislocations, stacking faults and twins (periodicity breaks where one portion of the lattice is a mirror image of another). Many defects, particularly threading dislocations, tend to propagate into the "device layer" where the semiconductor device is fabricated. Generally, the severity of defect generation correlates to the amount of lattice mismatch between the III-V semiconductor and the silicon substrate. For these reasons, the large lattice mismatch (approximately 19.2% between the exemplary indium antimonide (InSb) and silicon (Si) combination) typically results in an epitaxial device layer having a high defect density, on the order of $1 \times 10^9$ cm$^{-2}$ to $1 \times 10^{10}$ cm$^{-2}$. The high defect density reduces the carrier mobility theoretically possible in bulk InSb, eliminating many of the technical advantages of "InSb-on-silicon" integration. For example, the electron mobility in bulk InSb films is estimated to be approximately 76,000 cm$^2$/Vs. However, to date, the best reported electron mobility of an InSb film formed over a silicon substrate is significantly lower, approximately 40,000-50,000 cm$^2$/Vs.

Similarly, a high defect density is also detrimental to photonic devices formed in or upon III-V semiconductor device layers on silicon substrates. The recombination-generation (R-G) energies of crystal defects are typically mid-gap, detracting from the performance of a semiconductor device layer that has been band gap engineered for a particular optical wavelength.

Various buffer layers have been used in attempts to relieve the strain induced by the lattice mismatch between the silicon substrate and the III-V device layer and thereby reduce the detrimental defect density of the device layer. For example, as shown in apparatus 100 of FIG. 1A, a material forms a buffer layer 170 between a silicon substrate 110 and a III-V device layer 180. A semiconductor device 190 is then fabricated in or upon device layer 180. Various materials have been utilized as the buffer layer 170. For example, an aluminum antimonide (AlSb) buffer layer 170 has been attempted as has a strontium titanate (SrTiO$_3$) buffer layer 170 between a silicon substrate 110 and a III-V device layer 180. In practice however, as depicted in FIG. 1B, these buffer layers are unable to prevent twins 171, threading dislocations 173 and stacking faults 175 from propagating into the III-V device layer 180 as twins 181, threading dislocations 183, and stacking faults 185. Thus, there remains a need for a buffer layer architecture that enables lower defect density III-V semiconductor device layers formed upon silicon substrates.

DETAILED DESCRIPTION OF THE PRESENT INVENTION

In various embodiments, a composite buffer architecture for integrating III-V semiconductor devices on silicon substrates is described with reference to figures. However, certain embodiments may be practiced without one or more of these specific details, or in combination with other known methods and materials. In the following description, numerous specific details are set forth, such as specific materials, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

Figure 1A:
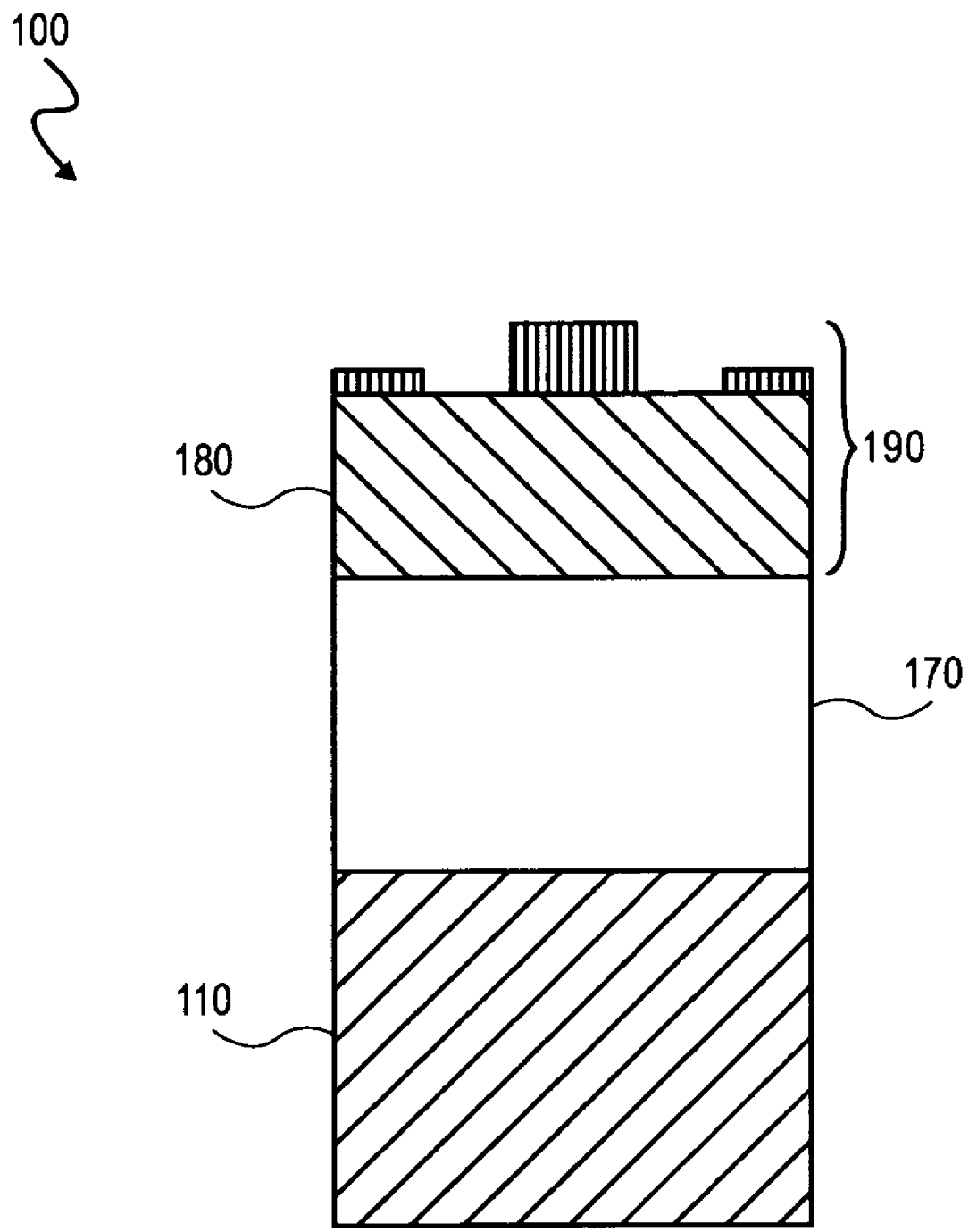
FIG. 1A is an illustration of a cross-sectional view of a conventional group III-V semiconductor device formed upon a silicon substrate.
Figure 1B:
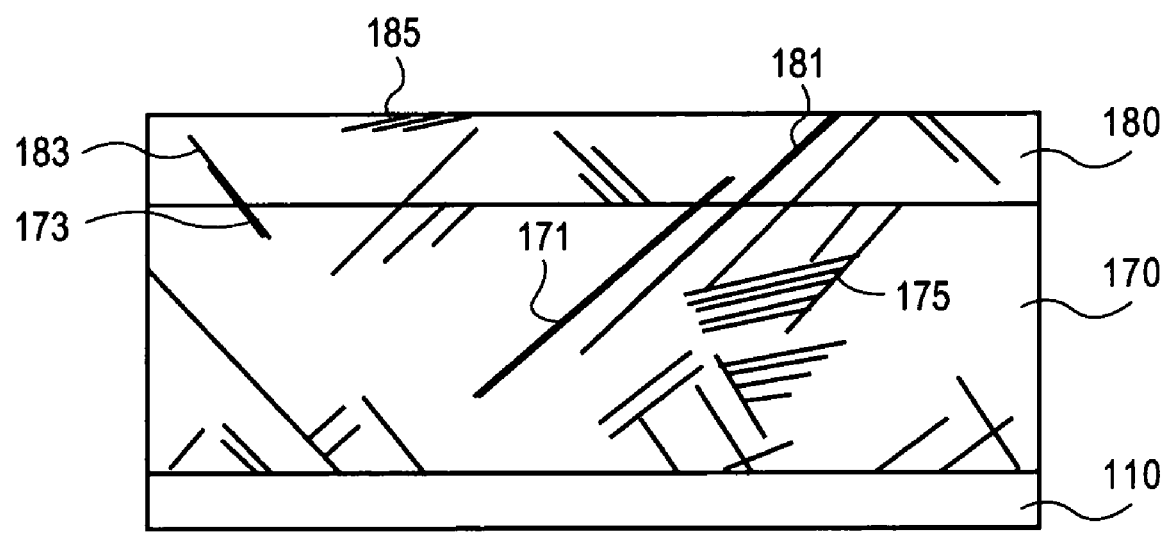
FIG. 1B is an illustration of a cross-sectional view of a conventional group III-V semiconductor device layer formed upon a silicon substrate.
Figure 2:
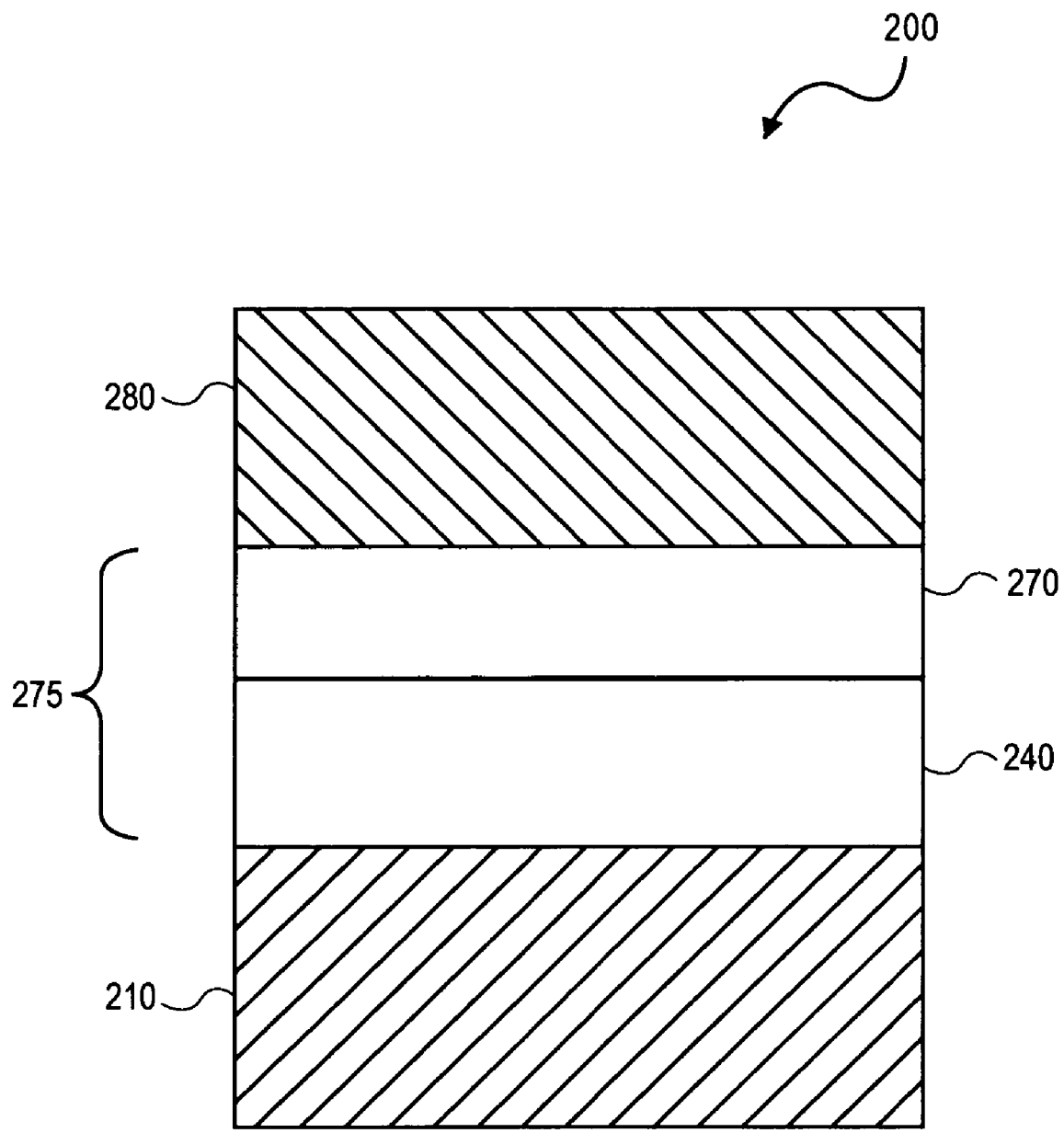
FIG. 2 is an illustration of a cross-sectional view of a group III-V semiconductor device layer formed upon a silicon substrate in accordance with the present invention.

Embodiments of the present invention reduce the dislocations within the III-V device layer formed over a silicon substrate to near bulk-like quality by utilizing a buffer architecture and specific fabrication techniques tailored to the particular III-V device layer desired. As shown in FIG. 2, embodiments of the present invention utilize a composite buffer 275 formed between silicon substrate 210 and III-V device layer 280 to form a semiconductor stack 200. Specific embodiments utilize a composite buffer 275 of a first III-V semiconductor material, layer 240, and a second III-V semiconductor material, layer 270. In embodiments of the present invention, the composite buffer 275 architecture is engineered for a particular III-V device layer material 280 with the materials for the first III-V buffer layer 240 and second III-V buffer layer 270 selected with consideration of lattice constant, band gap and melting point for the purpose of controlling nucleation and propagation of defects generated by lattice mismatch strain.

In particular embodiments, the first III-V buffer layer 240 is formed on a vicinal surface of silicon substrate 210 having regular arrays of double-stepped (100) terraces across the substrate surface. A vicinal surface is a higher order crystal plane of the silicon substrate, such as, but not limited to the (211), (511), (013), (711) planes. A vicinal substrate surface having double-stepped terraces is capable of suppressing anti-phase domains (APD) in the first III-V buffer layer 240. An APD is created when a first polar crystal domain of layer 240, having group III atoms attached to the nonpolar silicon substrate surface, meets a second polar crystal domain of layer 240, having group V atoms attaches to the silicon substrate. A crystal discontinuity forms in layer 240 at the border between these first and second domains providing recombination-generation centers detrimental to the operation of a semiconductor device. The term "polar" refers to the partially ionic bonding character between the constituents of a III-V compound semiconductor.

Embodiments providing the double atomic step in the silicon substrate 210 provide for a terrace level of sufficient depth to prevent the growth species of buffer layer 240 from bonding to a higher level terrace even after all binding sites in the lowest terrace are occupied. Thus, the double step terrace prevents ad-hoc surface bonding so that the growth of the first III-V buffer layer 240 proceeds in a stepwise fashion with each polar group III-V atomic bi-layer sequentially filling the lowest terrace of the nonpolar group IV, silicon substrate. In alternative embodiments, anti-phase domains are eliminated by growing layer 240 to a thickness greater than approximately 1.5 um. At such thicknesses, anti-phase domains are substantially annihilated and a single domain film can be formed even on first order planes, such as, but not limited to, the (100) silicon substrates commonly used for microelectronic fabrication.

In embodiments of the present invention, the total lattice mismatch between the silicon substrate and the III-V device layer is partitioned by the two III-V buffer layers, 240 and 270 comprising the composite buffer 275. Partitioning of the total lattice mismatch into three material interfaces provides an additional degree of freedom to incrementally control and direct the generation and propagation of the defects unavoidably formed by heteroepitaxy of materials having significantly different lattice constants. To partition the total lattice mismatch, each material layer within the composite buffer 275 possesses a lattice constant intermediate between the silicon substrate 210 and the desired III-V semiconductor device layer 280. Proper partitioning of the total lattice mismatch avoids too large of a lattice mismatch between adjacent materials. In a particular embodiment, the lattice constant of each material layer within the composite buffer 275 is intermediate between the layer upon which that layer is grown and the layer subsequently grown, upon that layer. Thus, in a particular embodiment, the first III-V buffer layer 240 has a lattice spacing larger than the silicon substrate 210, the second III-V buffer layer 270 has a lattice spacing larger than the first III-V buffer layer 240 and the III-V device layer 280 has a lattice spacing larger than the second III-V buffer layer 270. In one such an embodiment, composite buffer 275 is comprised of a gallium antimonide (GaSb) layer 240 and an aluminum antimonide (AlSb) layer 270 formed between the silicon substrate 210 and an indium antimonide (InSb) device layer 280. The 6.09 Å lattice constant of GaSb layer 240 is approximately 12.2% larger than the 5.43 Å lattice constant of the Silicon substrate 210 upon which layer 240 is formed. The 6.13 Å lattice constant of AlSb layer 270 is then approximately 0.65% larger than the GaSb layer 240. Finally, the 6.48 Å lattice constant of the InSb layer 280 is approximately 5.6% larger than the AlSb layer 270. Thus, in this particular embodiment, the lattice constant of the materials comprising the composite buffer 275 is gradually incremented from the lattice spacing of the silicon substrate 210 to the lattice spacing of the III-V device layer 280, thereby partitioning the total lattice mismatch between three separate material interfaces. In this manner, the InSb device layer 280 need only accommodate the strain of a 5.6% lattice mismatch with AlSb layer 270 rather than the entire 19.2% mismatch with the silicon substrate 210.

It should be appreciated that various III-V device layers, such as, but not limited to, indium arsenide (InAs) device layers may be similarly integrated with silicon substrates using other composite buffer embodiments. For example, in another embodiment of the present invention, buffer 275 is comprised of a gallium arsenide (GaAs) layer 240 and aluminum arsenide (AlAs) layer 270 is formed between the silicon substrate 210 and indium arsenide (InAs) device layer 280 to graduate the lattice constant between the layers 240 and 270 of the composite buffer 275 in a manner analogous to that just described for the InSb embodiment.

In embodiments of the present invention, the composite buffer 275 comprises materials which glide dislocations and terminate a significant percentage of the dislocations within the buffer layer 275. In particular embodiments, the first III-V buffer layer 240 is comprised of a relatively narrow band gap III-V semiconductor material. Generally, the extent of dislocation glide is dependent on the hardness of the material, with glide occurring more readily in softer materials. Semiconductor materials of narrower band gap are typically softer, and it has been found more dislocation glide occurs in narrower band gap materials. Furthermore, more of the dislocations are terminated or contained as the thickness of a material capable of dislocation glides is increased. In one particular embodiment, the first III-V buffer layer 240 is GaSb having a thickness between approximately 0.3 um and 5.0 um. GaSb readily glides defects because the band gap of GaSb is relatively narrow, approximately 0.7 eV. Dislocation glide occurring within the GaSb changes the direction a defect propagates. This is particularly true for threading dislocations which typically propagate at an approximate sixty degree angle from the substrate surface. Gliding can change the direction of a threading dislocation to an angle more parallel to the surface of the film to terminate or contain the dislocations within the film as the buffer layer is thickened. For this reason, many of the defects induced by the strain of the 12.2% lattice mismatch between the silicon substrate 210 and a first III-V buffer layer 240 of GaSb are glided and contained within the GaSb layer 240. Because many such glided dislocations will not propagate into subsequently grown films, it is therefore possible to avoid simply accumulating defects within the subsequent epitaxial layers. Thus, embodiments utilizing a III-V buffer layer comprising at least one relatively narrow band gap III-V buffer material are capable of incrementing the lattice spacing without propagating the defects generated by the lattice spacing increment. In this manner, the lattice mismatch between the silicon substrate 210 and the first III-V buffer layer 240 can be partitioned by the buffer layers without accumulating the associated defects.

In a further embodiment, the III-V buffer layer with the greatest ability to glide dislocations accommodates the largest portion of the total lattice mismatch between the silicon substrate 210 and the III-V device layer 280. In one such embodiment, the composite buffer 275 comprises a first III-V buffer layer of GaSb and a second III-V buffer layer of AlSb. As previously discussed, the 6.09 Å lattice constant of GaSb layer 240 is approximately 12.2% larger than the 5.43 Å lattice constant of the Silicon substrate 210 upon which layer 240 is formed. The 6.13 Å lattice constant of AlSb layer 270 is then approximately 0.65% larger than the GaSb layer 240. Because the band gaps of GaSb and AlSb are approximately 0.7 eV and 1.7 eV, respectively, the GaSb layer 240 is relatively softer and able to glide more dislocations than AlSb. Although the larger band gap AlSb has relatively less glide capability than GaSb, relatively fewer defects are introduced into the AlSb by the smaller strain from the 0.65% lattice mismatch between the GaSb layer 240 and AlSb layer 270. This is therefore another advantage the composite buffer 275 offers over a buffer comprised of a single layer of a material such as AlSb.

The interaction between the amount of lattice mismatch between two adjacent materials and the ability for a material to glide the ensuing dislocations is an important consideration the design of composite buffer layer 275. For example, in an embodiment of the present invention utilizing GaAs for the first III-V buffer layer 240 and AlAs for the second III-V buffer layer 270, the relatively lower band gap of GaAs provides better gliding and lower defects than the wider band gap AlAs. For this reason, even though GaAs and AlAs have nearly the same lattice mismatch with the silicon substrate 210, a composite buffer of GaAs and AlAs will propagate fewer defects into a subsequently grown device layer than a buffer comprised of AlAs alone due to the lattice mismatch partitioning and the relatively better gliding ability of GaAs. In the same vein, it should be apparent that an embodiment utilizing GaSb provides better dislocation glide characteristics than an embodiment utilizing GaAs for the first III-V buffer layer 240 because band gap of GaSb is lower than GaAs.

In embodiments of the present invention, the first III-V buffer layer 240 has a lower melting point than the second III-V buffer layer 270. The lower melting point temperature of the first III-V buffer layer 240 improves the thermal activation of dislocation glide within layer 240 during the subsequent growth of the second III-V buffer layer 270. A composite buffer architecture wherein the first III-V buffer layer 240 has a melting point that is lower than the melting point of the second III-V buffer layer 270 reduces the propagation of threading dislocations, stacking faults and twins into the second buffer layer 270. In a particular embodiment, for example, a first III-V buffer layer 240 of GaSb has a melting point of approximately 712C and a second III-V buffer layer 270 of AlSb has a melting point of approximately 1060C. In another particular embodiment, the melting point of a GaAs layer 240 is approximately 1237C while the melting point of an AlAs layer 270 is approximately 1740C. Generally, the lower the melting point of the material, the better the dislocation glide. As shown by these two exemplary embodiments, the relatively high melting points of aluminum containing compound semiconductor materials making them useful for the second III-V buffer layer 270 because the high temperature epitaxial growth process increases the thermally activated dislocation gliding in buffer layer 240, which is discussed in greater detail below.

In embodiments of the present invention, the composite buffer 275 provides a highly resistive buffer layer over which the III-V device layer 280 can be fabricated. Generally, semiconductor resistivity depends directly on the band gap of a material, with wider band gap materials having higher resistivity. If the band gap is greater than approximately 1.4 eV, the semiconductor is commonly referred to as "semi-insulating" or "isolative" because the resistivity of the material is very high, on the order of approximately $1 \times 10^7$ ohm-cm. GaAs and indium phosphide (InP) are two examples. Thus, while dislocation glide improves with smaller band gap, electrical resistivity improves with larger band gap. However, in embodiments of the present invention, both dislocation glide and isolation can be achieved with the composite buffer 275.

In particular embodiments, the composite buffer 275 includes a wide bandgap buffer layer having a thickness ranging from approximately 0.2 um to many microns. Specifically, in one embodiment, a second III-V buffer layer 270 comprising AlSb having a thickness between approximately 0.2 um and 5 um provides high resistivity for excellent device isolation and low capacitance. Similarly, for a GaAs/AlAs composite buffer embodiment, the second III-V buffer layer 270 comprising AlAs is semi-insulating or highly resistive. In an alternate embodiment, the second III-V buffer layer 270 can be formed of an aluminum gallium antimonide alloy ($Al_xGa_{1-x}Sb$), wherein the Al content ranges from 0.1 to 1.0. In one such embodiment, the second III-V buffer layer 270 contains sufficient aluminum for the band gap to be at least approximately 1.4 eV and therefore semi-insulating. In a specific embodiment, the aluminum (Al) faction, x, is between 0.3 and 0.6. This $Al_xGa_{1-x}Sb$ alloy may be a compositionally graded from GaSb to AlSb using either linear or step-graded compositions of Al. For example, the second III-V buffer layer can be graded from 0% Al at the interface of the first III-V buffer layer 240 to 60% Al at the interface of the III-V device layer 280. Optionally, the grading can be continued to 100% Al (AlSb) in the second III-V buffer layer. In still other embodiments, composite buffer layer 275 provides device isolation by doping at least one of the buffer layers 240 or 270 to a conductivity type that is complementary to the conductivity type of the devices formed in the III-V device layer 280. Such complementary doping provides junction isolation, as commonly known in the art. In one such embodiment, buffer layer 270 is p-type and device layer 280 comprises an n-type quantum well (QW) transistor.

Figure 3A:
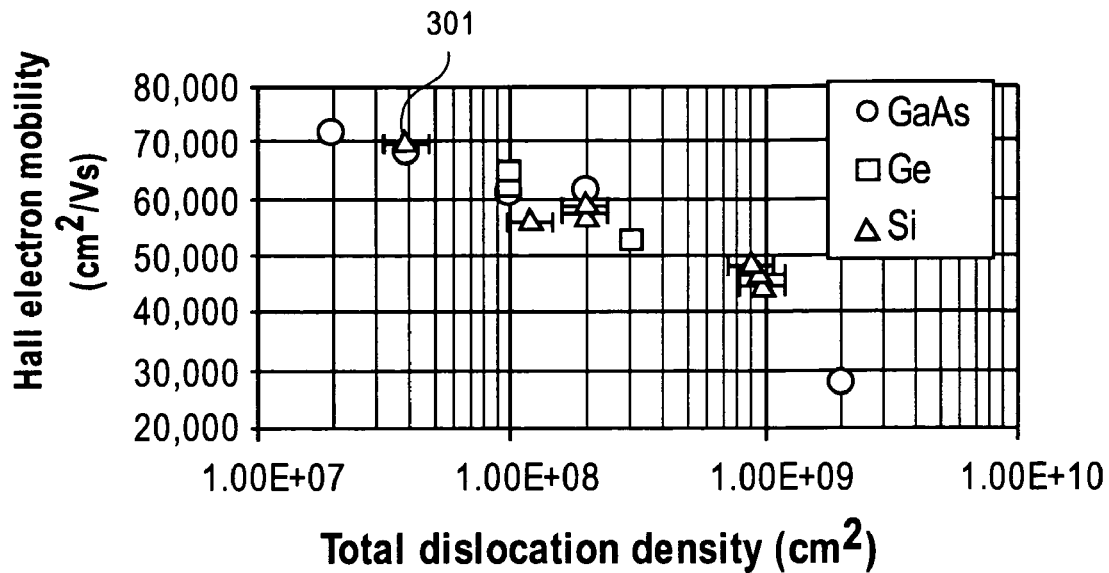
FIG. 3A is a graph of the dependency of defect density on carrier mobility of a III-V semiconductor device layer achieved with embodiments in accordance with the present invention.

In particular embodiments, the composite buffer 275 architecture achieves a device layer having an acceptably low final defect density. Shown in FIG. 3A is the dependency of Hall electron mobility of InSb formed on various substrates as a function of the InSb defect density. FIG. 3A indicates the InSb device layer defect density must be below $1 \times 10^8$ cm$^{-2}$ to approach the bulk InSb mobility of approximately 76,000 cm²/Vs. Data point 301 represents an experimental measurement of a particular embodiment of the present invention wherein the composite buffer 275 of FIG. 2 is comprised of a GaSb layer 240 and an AlSb layer 270 between a silicon substrate 210 and InSb layer 280. For such embodiments, the composite buffer 275 accommodates the approximate 19.2% lattice mismatch between InSb device layer 280 and silicon substrate 210 to obtain a device layer having a defect density of approximately $4 \times 10e^7$ cm$^{-2}$.

Figure 3B:
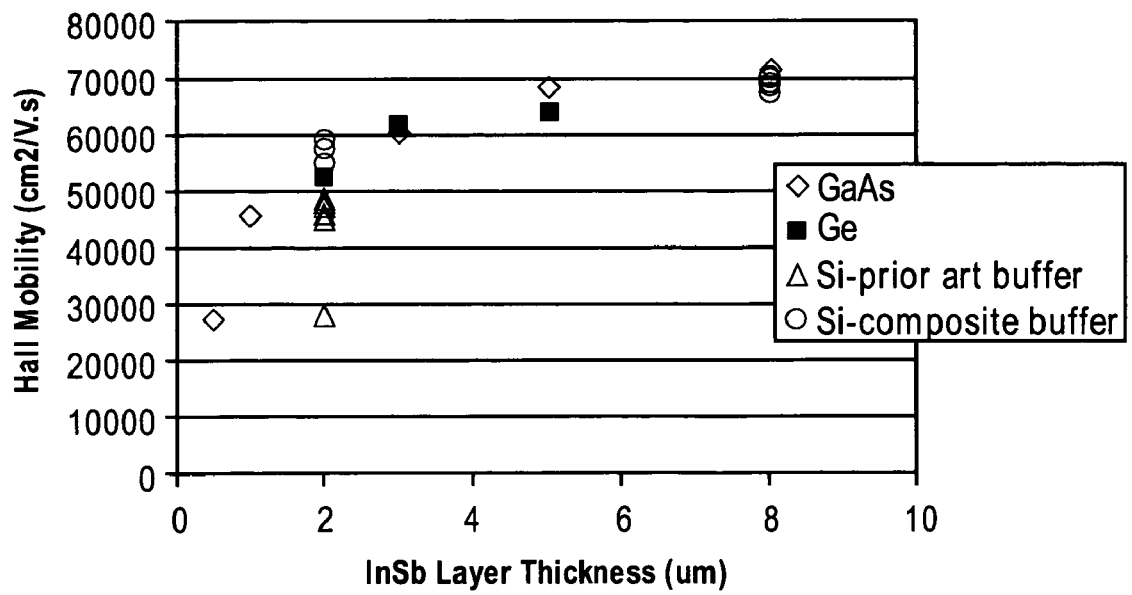
FIG. 3B is a graph of the carrier mobility of a III-V semiconductor device layer achieved with embodiments in accordance with the present invention.

In embodiments of the present invention, the III-V device layer 280 of FIG. 2 is of the desired material and of a sufficient thickness to achieve low defect density. Because the lattice spacing of the III-V device layer 280 is considered in the design of the composite buffer 275, the III-V device layer 280 has significantly less lattice mismatch relative to the composite buffer 275 than to the silicon substrate 210. A substantial portion of the defects in device layer 280 generated by lattice mismatch strain or propagated from the composite buffer 275 are glided within III-V device layer 280 as the thickness of 280 is increased. Thus, as shown in FIG. 3B, thicker device layers display superior Hall electron mobility. In a particular embodiment of the present invention incorporating a GaSb/AlSb composite buffer 275, an InSb device layer 280 less than 2.5 um thick displays a Hall-measured electron mobility of approximately 55,000-60,000 cm²/Vs. In another particular embodiment of the present invention incorporating a GaSb/AlSb composite buffer 275, an InSb device layer 280 at least 7.5 um thick displays a Hall-measured electron mobility of approximately 70,000 cm²/Vs. Thus, the present embodiments provide for device-grade InSb on silicon substrates enabling electronic structures such as quantum well transistors to be formed on silicon substrates.

Figure 6:
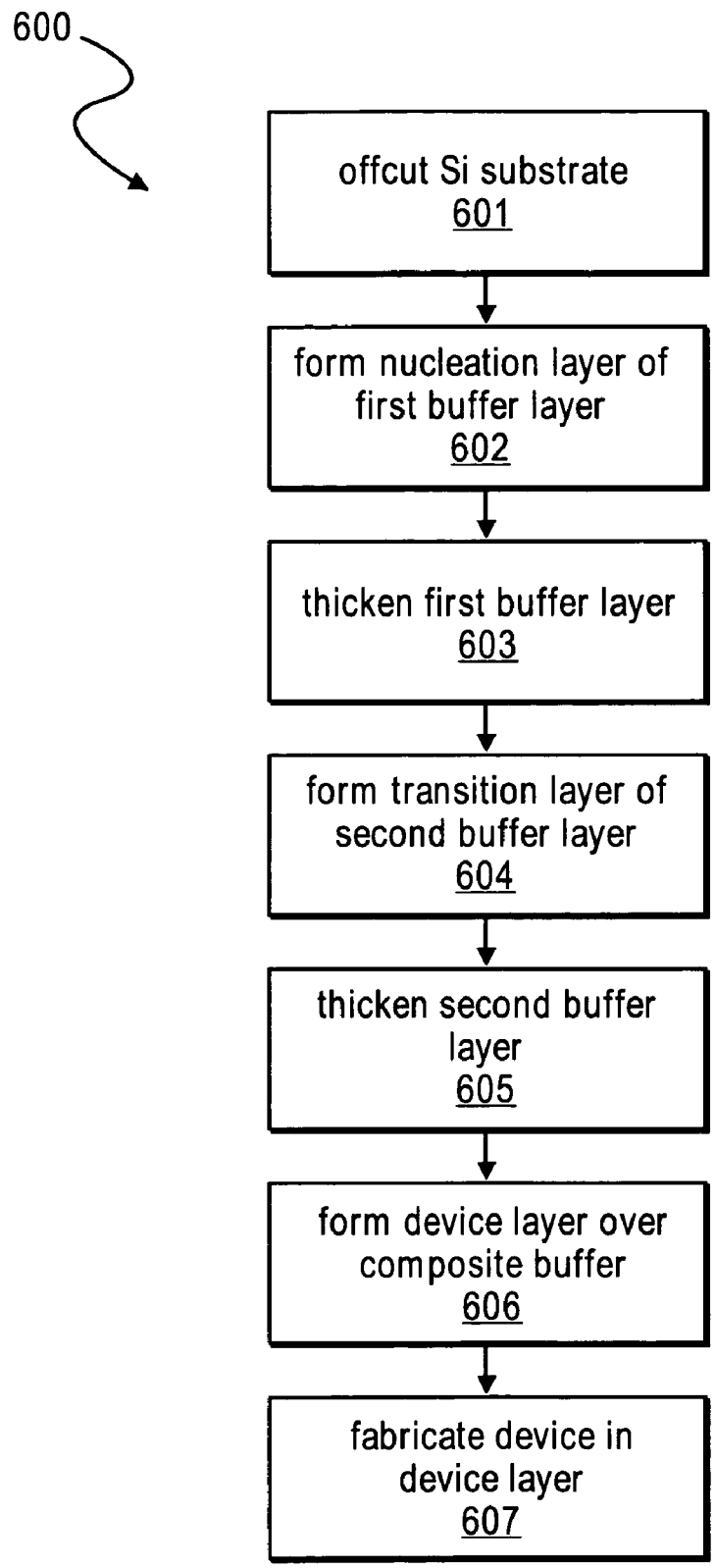
FIG. 6 is a flow diagram of a method of fabricating a group III-V semiconductor device layer upon a silicon substrate in accordance with the present invention.

FIG. 6 is a flow diagram of a method to fabricate a III-V device layer in accordance with an embodiment of the present invention. Method 600 of FIG. 6 begins with an offcut silicon substrate at step 601. At step 602, a nucleation layer is formed as the initial step of a two step process to form a first buffer layer. At step 603, the first buffer layer is thickened with a growth process distinct from that used at step 602. In step 604, a transition layer is formed as the initial step of a two step process to form a second buffer layer upon the first buffer layer. Then, at step 605, the second buffer layer is thickened with a growth process distinct from that used at step 604. In step 606, a III-V device layer is formed over the composite buffer and a device is fabricated in the III-V device layer at step 607. Each of these steps is discussed in greater detail below in reference to FIGS. 4A-4F.

Figure 4A:
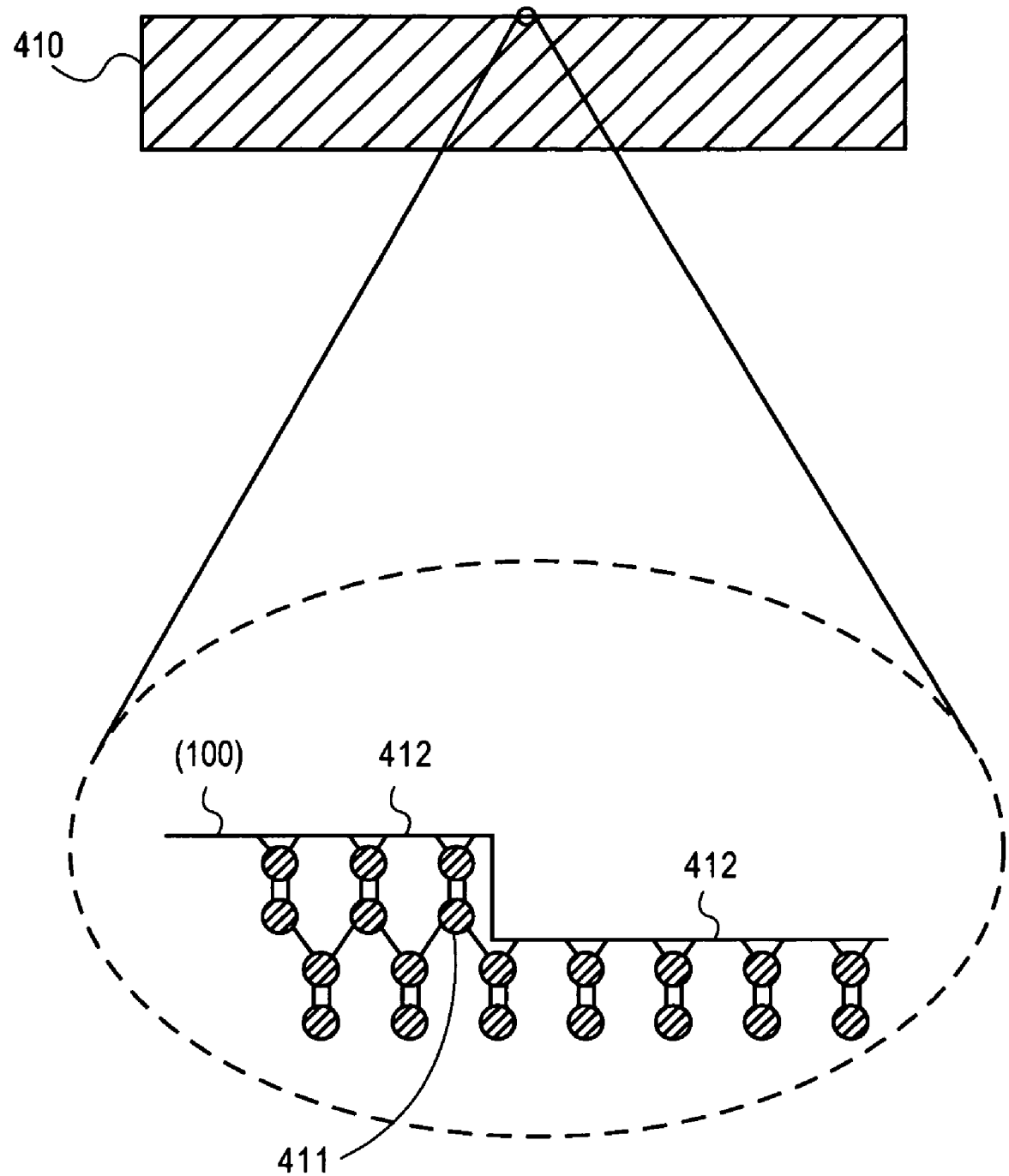
FIGS. 4A-4F are illustrations of cross-sectional views of a method of fabricating a group III-V semiconductor device layer upon a silicon substrate in accordance with the present invention.

Fabrication begins with silicon substrate 410. In a particular embodiment, substrate 410 has a vicinal surface, as shown in FIG. 4A. A vicinal surface is prepared by off-cutting the substrate from an ingot. In one such embodiment, the ingot is grown to provide wafer slices having (100) surfaces. The (100) substrate surface is then offcut at an angle between 2 and 12 degrees towards the [110] direction to produce a surface having terraces 412. Terraces 412 include a surface having a (100) crystal plane. The (100) plane surface area of each terrace 412 depends on the specific offcut angle, with a greater angle producing a greater number of terraces, each terrace having lesser (100) surface area. In such embodiments, the offcut produces a vicinal surface having an array of (100) terraces, many of which are separated by a double atomic step. As shown in the expanded view of FIG. 4A, a double step terrace has a height of two silicon atoms 411. In another embodiment, the silicon substrate offcut orientations are (211), (511), (013), (711) and other high index plans. Optionally, silicon substrate 410 is without an offcut (zero degree offcut), such as, but not limited to, common (100) substrates. Such a substrate (not pictured) typically does not have a substantial number of double atomic step terraces.

Next, the first III-V buffer layer is formed upon the silicon substrate 410. Commonly known growth techniques may be used to form the III-V buffer layers, such as, but not limited to, metalorganic chemical vapor deposition (MOCVD) or molecular beam epitaxy (MBE). As previously discussed, in particular embodiments, the buffer is formed in a manner that either avoids the formation of anti-phase domains (APD) or annihilates them as the film thickness is increased.

Figure 4B:
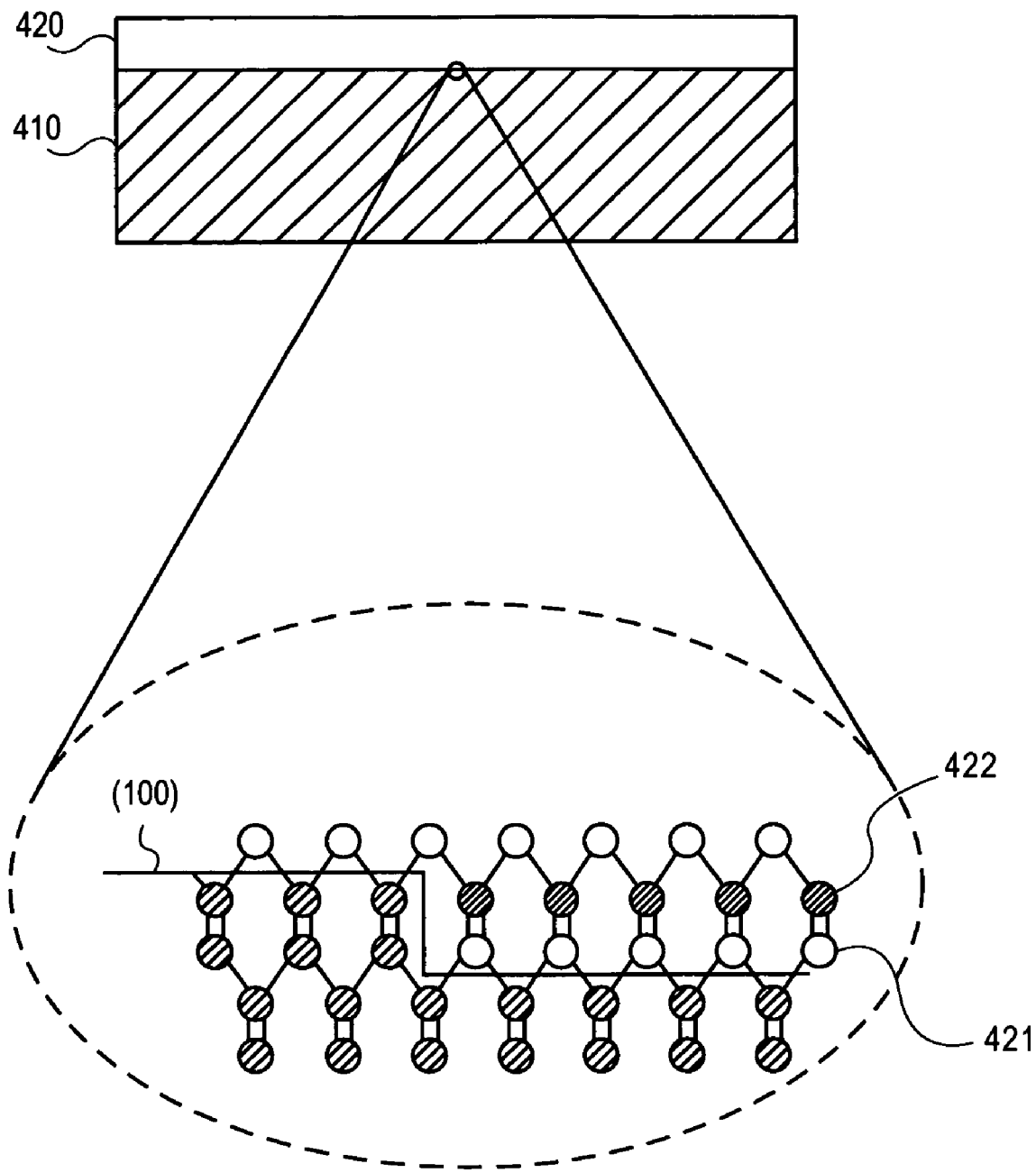
Figure 4C:
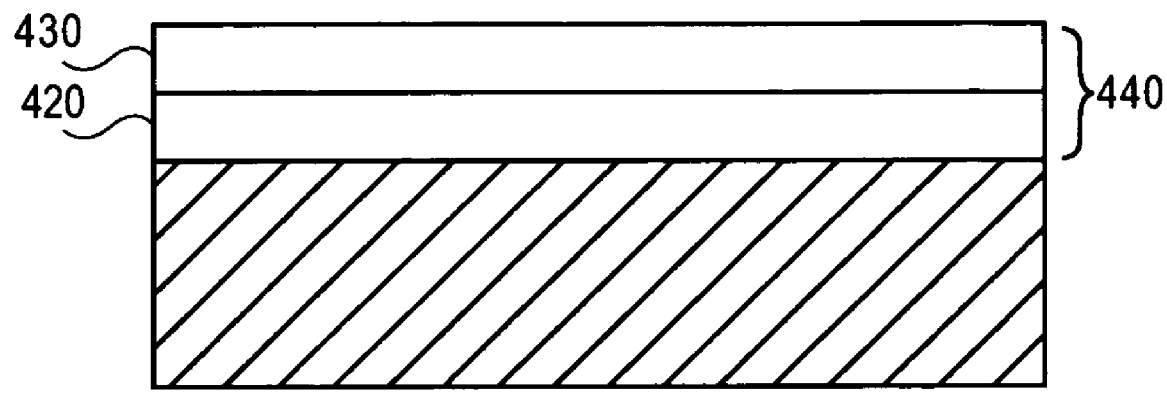

In a particular embodiment, as shown in FIG. 4B and FIG. 4C, the first III-V buffer layer is formed using a two step process, wherein the growth conditions of each step are distinct. In the first step, as shown in FIG. 4B, a nucleation layer 420 is formed. The growth of nucleation layer 420, as shown in the expanded view, successively fills the lowest silicon substrate terraces with atomic bi-layers of the III-V semiconductor buffer material. In this embodiment, the mobility of both the group III and group V species of the nucleation layer 420 are sufficiently high that the atomic species introduced to the silicon surface travel about the surface of silicon substrate 410 and either fall into a terrace or completely off the silicon substrate surface. A species which falls down a terrace wall lacks the energy to scale back up the terrace wall, therefore the otherwise substantially random species motion can be effectively funneled in a direction dictated by the substrate terracing. Once the species reaches the lowest terrace, the silicon substrate bonding sites are located by the mobile species until every site is filled. Because of the double atomic step in the silicon substrate 410, a terrace completely filled with species 421 presents a single atomic step which the mobile species is unable to scale, and so excess species travel off the substrate surface without a significant number bonding to sites in the upper terrace levels. Subsequent introduction of the second species of the polar atomic pair is similarly funneled to the lowest terrace to bond with the first atomic species 421 to completely fill the lowest terrace with species 422. The growth process then proceeds in this iterative fashion until all terraces are filled and no nonpolar silicon substrate surface remains, at which point there is no longer risk of forming an APD in the polar buffer materials. Thus, depending on the offcut angle of the substrate, the number of terraces which must be successively filled varies. As the offcut angle increases, the number of terrace levels increases and the thickness of the nucleation layer must be increased to fill every terrace. In particular embodiments, therefore, the nucleation layer 420 is between approximately 50A and approximately 500A.

The high mobility required to ensure the terraces are successively filled is provided for by the growth parameters of the nucleation layer 420 and these parameters therefore depend on the particular mobility characteristics of species comprising the material of layer 420. For example, in one embodiment, a nucleation layer 420 is formed using migration enhanced epitaxy (MEE) at a temperature of between 300C and 600C. MEE proceeds in a fashion similar to that of atomic layer deposition (ALD). MEE has a relatively slower growth rate, approximately 0.1 um/hr, because once the group V element is introduced to the substrate there is a hold time during which both the group V source and group III source shutters are closed (shuttered). This hold time accommodates the relatively lower mobility of the group V species. No hold time is required for group III species because surface migration of this species relatively higher mobility. In a particular MEE embodiment, the substrate surface is exposed to an antimony (Sb) source for approximately 10 seconds to form a monolayer of Sb on the lowest terrace level. The Sb source and is then shuttered for a hold time of approximately 60 seconds. This relatively long hold time allows for the Sb species to migrate on the surface of the silicon substrate to ensure the bonding sites of the lowest terrace level are filled. Then, the substrate surface is exposed to a gallium (Ga) source for approximately 10 seconds. No hold time is required because of the high surface mobility of Ga. Next, the Sb is reopened for approximately 10 second and then again closed for a hold time. This process is repeated to form a GaSb nucleation layer 420 sufficiently thick to fill all the terraces of the silicon substrate 410, approximately 150A in a particular embodiment. In an embodiment, GaSb nucleation temperatures are in between 300C and 600C. In particular GaSb embodiment, the MEE growth temperature is between approximately 400C and approximately 510C. Higher temperature embodiments enable a higher quality film. In other embodiments, MEE can be utilized to form a nucleation layer of an alternate buffer material, such as, but not limited to GaAs.

In yet another embodiment, a nucleation layer 420 is formed on the vicinal silicon substrate 410 utilizing traditional MBE (without migration enhancement). The relatively higher flux of this particular embodiment using traditional MBE provides higher film growth rates and therefore higher throughput than MEE embodiments. In a particular MBE nucleation embodiment, GaSb is formed on the silicon substrate 410 at a temperature between approximately 400C and approximately 510C. The high-flux embodiments are well suited to GaSb because of the relatively low vapor pressure and high sticking coefficient of antimony (Sb) as compared to arsenic (As) of GaAs films.

Next, as shown in FIG. 4C, a second growth step completes the formation of the first III-V buffer layer 440. This second growth step, performed at a higher temperature than that used for the nucleation layer 420, forms layer 430 to thicken the first III-V buffer layer 440 and glide dislocations. The film quality of layer 430 is superior to that of the nucleation layer 420 because it is formed at a higher growth temperature. Also, during the formation of layer 430, the flux rate can be relatively high because the polar nucleation layer 420 eliminates any danger of APD formation. In an embodiment, a GaSb film 430 is grown upon a GaSb nucleation layer 420 at a growth temperature in the range of 500C and 700C. In a particular embodiment, a GaSb film 430 is grown upon a GaSb nucleation layer 420 at a growth temperature between approximately 510C and approximately 570C. In embodiments of the present invention, the GaSb film 430 is grown to a thickness between approximately 0.3 um and 5.0 um. In an alternate embodiment, a GaAs film 430 is grown in a similar fashion upon a GaAs nucleation layer 420.

In still another embodiment, the first III-V buffer layer 440 is formed on a traditional silicon substrate 410 having a lower order plane surface, such as, but not limited to (100). The first III-V buffer layer is grown without a nucleation step and permitted to formed anti-phase domains. In an embodiment, the single-step growth is performed at a temperature between 500C and 700C. Once the film thickness is greater than approximately 1.5 um, the anti-phase domains are substantially annihilated and the film becomes single-domain. In a particular embodiment, a first III-V buffer layer 440 comprising between approximately 1.5 and 2.0 um GaSb is formed on a traditional (100) silicon substrate 410 that has a 0 degree offcut.

Figure 4D:
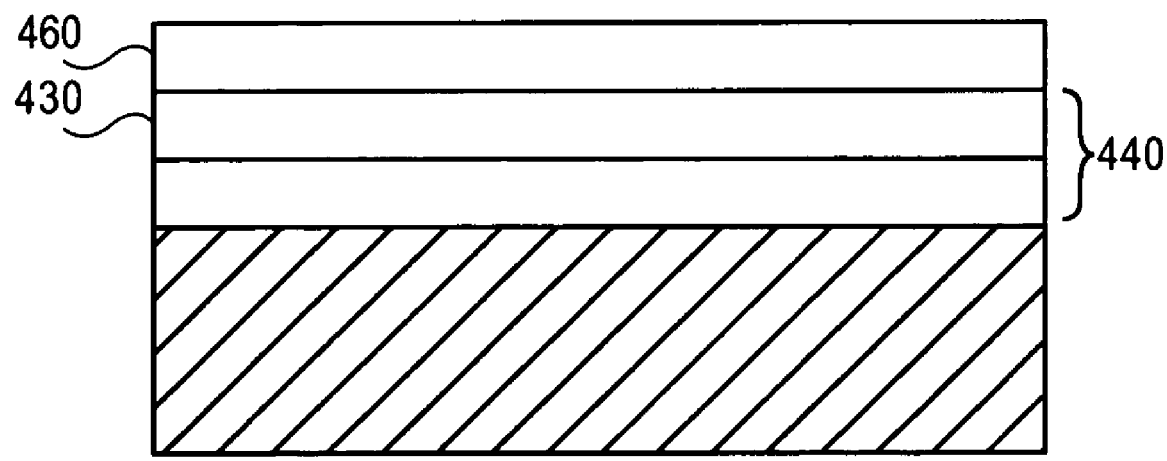

Following the completion of the first III-V buffer layer 440, a second III-V buffer layer 470 is formed. In particular embodiments, a two step growth process is utilized for form the second III-V buffer layer 470 wherein the growth conditions of each step are distinct. As shown in FIG. 4D, the first growth step forms a transition layer 460 upon the first III-V buffer layer 440. Transition layer 460 should be of sufficient thickness to prevent out migration of species from the first III-V buffer layer 440 during the growth of the isolative buffer material. In particular embodiments the thickness of the transition layer 460 is between approximately 0.05 um and 0.25 um. Out migration from the first III-V buffer layer 440 is a concern, especially for the high vapor pressure group V species, because, in certain embodiments, the isolative buffer material is grown at a higher temperature than the growth temperature of the first III-V buffer layer 440. To prevent out migration of the first III-V buffer layer 440 during formation of the transition layer 460, the growth temperature of transition layer 460 is no higher than the highest growth temperature of the III-V buffer layer 440. In an embodiment, AlSb transition layer 460 is be grown at the same growth temperature of GaSb layer 430. For example, in a specific embodiment wherein a GaSb layer 430 is grown at approximately 510C, an AlSb transition layer 460 is also grown at approximately 510C to a thickness between 0.05 um and 0.2 um.

Figure 4E:
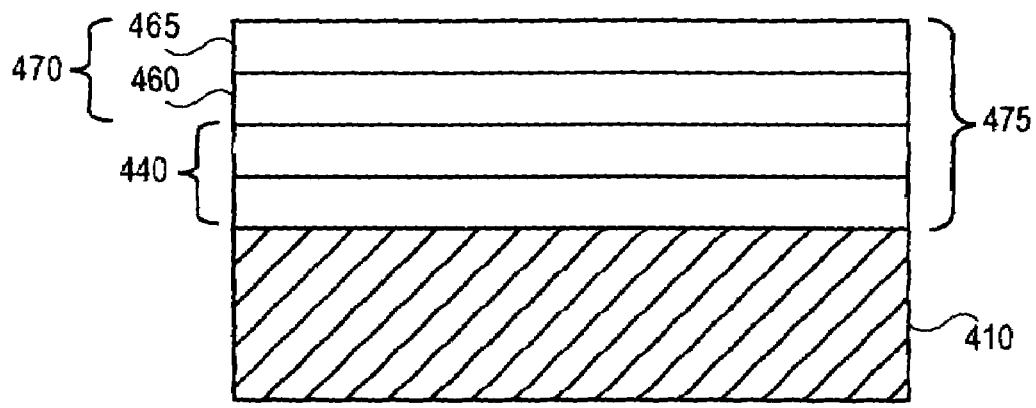

In particular embodiments, as shown in FIG. 4E, the second III-V buffer layer 470 is formed at temperature significantly higher than the highest growth temperature of the first III-v buffer layer 440. The higher growth temperature step forming layer 465 is limited by the melting point of the first III-V buffer layer 440. A high growth temperature serves two purposes. First, wide band gap semiconductors typically require relatively high temperatures to form high quality isolative films. For example, aluminum has relatively poor mobility and so aluminum containing films require a relatively higher deposition temperature to form films with a smooth surface. Second, the relatively higher growth temperature of layer 465 thermally activates dislocation glide within the first III-V buffer layer 440 to minimize the propagation of threading dislocations into the subsequently grown films. Thus, the high temperature growth step of the second III-V buffer layer 470 anneals the first III-V buffer layer 440. In a further embodiment, an AlSb layer 465 is grown at a temperature between approximately 510C and approximately 570C upon an AlSb transition layer 460 over a GaSb buffer layer 440. The thickness of the layer 465 depends on the resistivity desired. In particular embodiments, the thickness of layer 465 is between approximately 0.2 um and 5 um. In a specific embodiment, an AlSb layer 465 is grown to approximately 1 um thick. In an alternate embodiment, a percentage of gallium (Ga) is included to form an $Al_xGa_{1-x}Sb$ buffer layer 465. In this embodiment, commonly known methods are used to incorporate between approximately 30% to approximately 60% aluminum (Al) so that the band gap of layer 465 is above approximately 1.4 eV. In certain embodiments, the second III-V buffer layer 470 comprising transition layer 460 and layer 465 may be step graded from the composition of the GaSb first III-V buffer layer until the desired band gap is reached or to the full band gap of AlSb. In such an embodiment, the composition of transition layer 460 can be integrated with the grading of layer 465 to form the graded second III-V buffer layer 470. In yet another embodiment, the second III-V buffer layer 470 can be in-situ doped to provide for junction isolation between the second III-V buffer layer 470 and a subsequently formed device layer. In such embodiments, either or both layers 460 and 465 of the second III-V buffer layer 470 may be doped. In a particular embodiment, the entire second III-V buffer layer 470 is doped p-type.

The interaction between the growth of the first III-V buffer layer 440 and the growth of second III-V buffer layer 470 is a further consideration in the architecture of the composite buffer. For example, in one embodiment, both the first III-V buffer layer 440 and second III-V buffer layer 470 are formed successively without breaking vacuum (in-situ). In a particular embodiment, an AlSb buffer layer 470 is grown in-situ upon a GaSb layer 440. While there is no detrimental interaction between a GaSb buffer layer 440 and an in-situ grown AlSb buffer layer 470, because the vapor pressure of antimony (Sb) is less than that of arsenic (As), an in-situ growth of an AlSb buffer layer 470 over a GaAs buffer layer 440 can result in a detrimental incorporation of As from the chamber walls of the epitaxial reactor into an in-situ grown AlSb buffer layer 470. Thus, the architecture of the composite buffer must consider the impact that growth of first III-V buffer layer 440 will have on the film quality of the second III-V buffer layer 470.

Figure 4F:
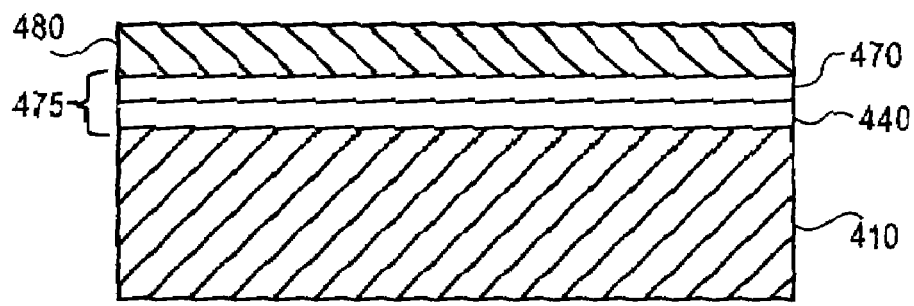

Finally, with the completion of the composite buffer 475, device layer 480 is formed, as shown in FIG. 4F. Device layer 480 is grown at a temperature appropriate for the particular III-V material desired. In a particular embodiment, wherein composite buffer 475 comprises a GaSb buffer layer 440 and AlSb buffer layer 470, an InSb device layer 480 is formed at a growth temperature between approximately 350C and approximately 475C. Depending on the amount of lattice mismatch between the composite buffer 475 and the III-V device layer 480, as well as the ability for the device layer to glide dislocations, the device layer 480 is grown to a thickness sufficient to give an acceptable defect density. In a particular embodiment, an InSb device layer 480 is grown to a thickness greater than approximately 2 um. In a further embodiment, an InSb device layer 480 is grown to a thickness of approximately 8 um to achieve a defect density of approximately $4 \times 10^7$ cm$^{-2}$, referring back to FIG. 3A and FIG. 3B.

Figure 5A:
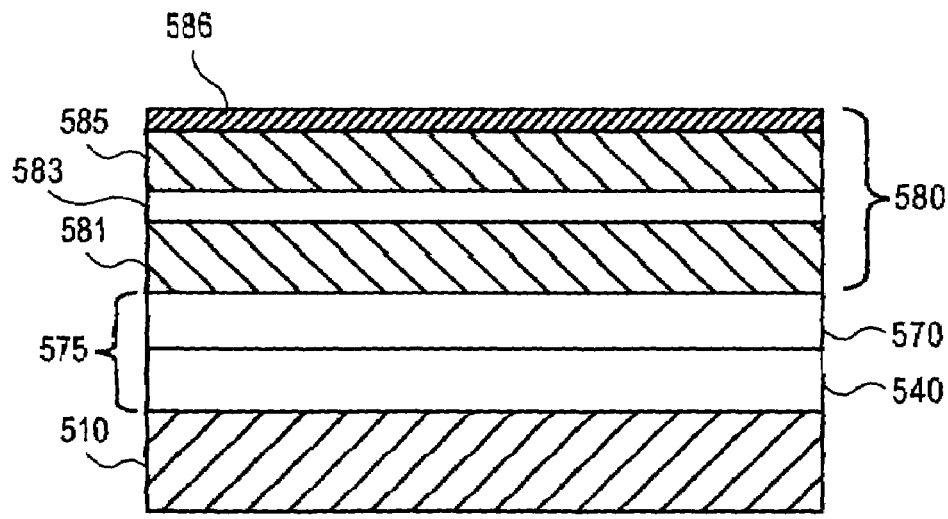
FIGS. 5A-5C are illustrations of cross-sectional views of a method of fabricating a quantum well (QW) transistor in accordance with the present invention.
Figure 5B:
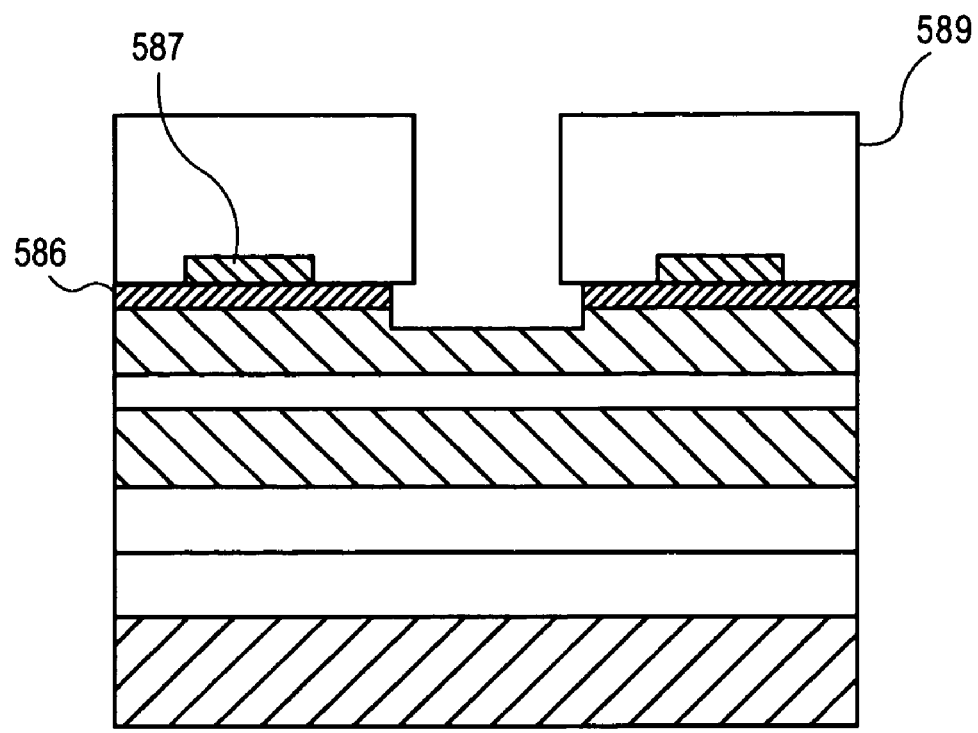
Figure 5C:
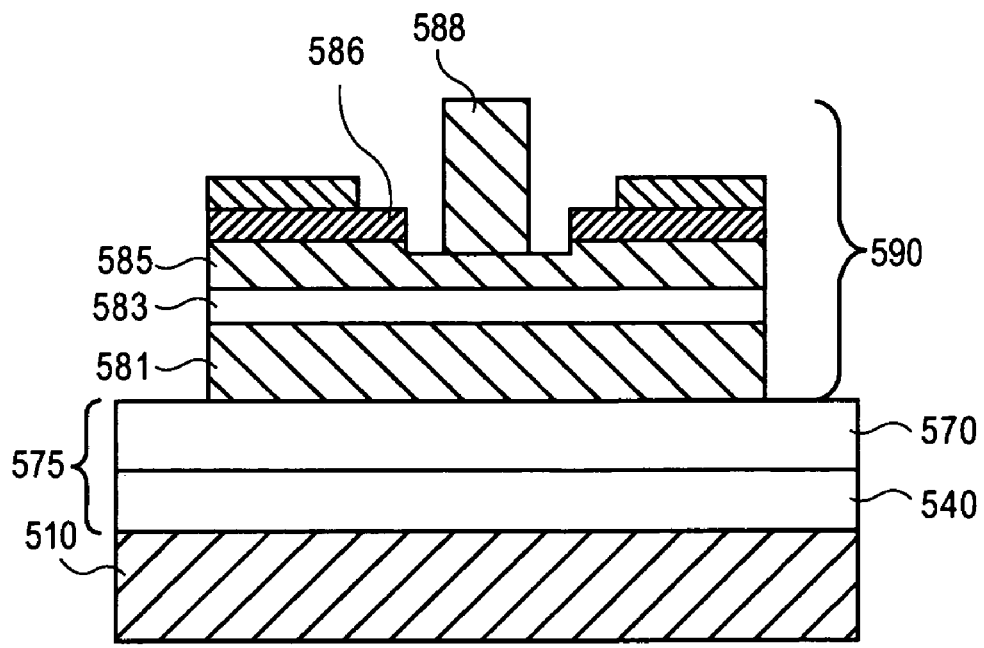

FIGS. 5A-5C depict embodiments of methods to fabricate a quantum well transistor in a III-V device layer on a substrate incorporating embodiments of the III-V buffer architecture discussed. FIG. 5A shows device layer 580 comprising a quantum well 583 between an upper barrier layer 585 and a lower barrier layer 581 formed upon the composite buffer 575 over silicon substrate 510.

Generally, the lower barrier layer 581 is formed of a higher band gap material than the overlying quantum well 583. The lower barrier layer 581 is of sufficient thickness to provide a potential barrier to charge carriers in the transistor channel. In a particular embodiment, the lower barrier layer thickness is between about 100 Å and about 250 Å. In other embodiments, the lower barrier is InAlSb between 2500 Å and 3000 Å thick. In still other embodiments, lower barrier layer 581 is microns thick to further reduce defect density in the quantum well 583. In certain embodiments wherein the buffer 575 is comprised of a GaSb buffer layer 540 and AlSb buffer layer 570, the lower barrier layer 581 is comprised of aluminum indium antimonide (Al$_x$In$_{1-x}$Sb). In a particular embodiment, the lower barrier layer 581 is Al$_x$In$_{1-x}$Sb with 15% aluminum. In certain other embodiments wherein the composite buffer 575 is comprises GaAs buffer layer 540 and AlAs buffer layer 570, the lower barrier layer 581 is comprised of indium aluminum arsenide (InAlAs).

Then, over the lower barrier layer 581, a quantum well 583 is formed of a material with a smaller band gap than that of the lower barrier. In an embodiment wherein the composite buffer 575 comprises GaSb buffer layer 540 and AlSb buffer layer 570, the quantum well 583 is doped or undoped and formed of InSb. In another embodiment wherein the composite buffer 575 comprises GaAs buffer layer 540 and AlAs buffer layer 570, the quantum well 583 is doped or undoped and formed of indium gallium arsenide (In$_x$Ga$_{1-x}$As) or InAs, as two examples. Quantum well 583 is of a sufficient thickness to provide adequate channel conductance. In certain embodiments, the thickness of the quantum well 583 is between about 50 Å and about 300 Å.

Over the quantum well 583 is the upper barrier layer 585. Upper barrier layer 585 has a larger band gap than the quantum well 583, thereby confining a majority of charge carriers within the quantum well 583 for reduced device leakage. The upper barrier layer 585 may be formed of the same or different materials as the lower barrier layer 581. In certain embodiments wherein the composite buffer 575 comprises a GaSb layer 540 and AlSb layer 570, the upper barrier layer 585 comprises aluminum indium antimonide (Al$_x$In$_{1-x}$Sb). In a particular embodiment, the upper barrier layer 585 is Al$_x$In$_{1-x}$Sb with 15% aluminum. In certain other embodiments, wherein the composite buffer 575 comprises GaAs buffer layer 540 and AlAs buffer layer 570, the upper barrier layer 585 comprises indium aluminum arsenide (InAlAs). The upper barrier layer 585 may include a delta-doped layer (not shown) to supply carriers for embodiments where the lower quantum well is undoped (optionally the lower barrier 581 may be similarly doped to supply carriers). For an n-type device utilizing an Al$_x$In$_{1-x}$Sb upper barrier 585, the delta doping may be done using silicon (Si) or tellurium (Te) impurities, as two examples. The upper barrier layer 585 may have various thicknesses and in certain embodiments the upper barrier layer 585 is between about 40 Å and 400 Å thick.

Finally, to complete device layer 580 as shown in FIG. 5A, a highly-doped source drain layer 586 is formed above the upper barrier layer 585. In a particular embodiment, the source drain layer 586 is n+ doped InSb between about 30 Å to about 300 Å thick.

As shown in FIG. 5B, source and drain contact metallizations 587 are then formed by commonly known deposition processes, such as electron beam evaporation or reactive sputtering. In various embodiments, as shown in FIG. 5B, a mask material 589 is used to selectively remove a portion of the semiconductor device stack in preparation for the placement of the gate electrode. Depending on whether a depletion mode or enhancement mode device is desired, selective etches may be used to form a recess having a particular depth. In particular embodiments, source drain layer 586 is removed during the gate recess etch to expose a suitable Schottky surface on the upper barrier layer 585. Commonly known dry or wet etch techniques may be utilized to form the gate recess. The etchant may be selective to the composition of the semiconductor, for example, in an embodiment, an n+ doped indium antimonide (InSb) source drain layer 586 is selectively removed using a wet etch process comprised of citric acid and peroxide. Through application of similar commonly known selective etch techniques, the recess etch depth may be tightly controlled by terminating on a stop layer grown upon the upper barrier layer 585 (not shown).

As shown in FIG. 5C, the gate electrode 588 is formed over the upper barrier layer 585. In some embodiments of the present invention, commonly known techniques are used to form the gate electrode 588 directly on the upper barrier layer 585, thereby creating Schottky junction through which the gate controls the quantum well 583. In other embodiments, commonly known techniques are used to form the gate electrode 588 on a dielectric layer over the upper barrier layer 585, thereby creating a MOS junction. In particular embodiments, the gate electrode 588 is formed using commonly known lift-off methods relying on lithography and highly directional deposition techniques, such as electron beam deposition, to separate the gate electrode 588 from the source drain layer 586.

Then, as shown in FIG. 5C, the quantum well transistor 590 is isolated using commonly known techniques. In particular embodiments, the epitaxial device layer of the quantum well transistor 590 is etched through to form an active device mesa upon the composite buffer 575 over silicon substrate 510. The isolation etch removes the source drain layer 586, upper barrier 585, quantum well 583 and lower barrier 581 along a perimeter of the active device to form the mesa. As previously described, the isolative character of the composite buffer 575 provides sufficient device isolation between the transistor 590 and neighboring devices. Thus, in particular embodiments, the isolation etch is stopped when the composite buffer 575 is exposed. This enables device isolation to be achieved with minimal topography. With the quantum well transistor 590 substantially complete, backend processing is performed using commonly known techniques to connect quantum well transistor 590 to the external environment.

Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. An apparatus comprising:
   a silicon substrate;
   a buffer on the silicon substrate, wherein the buffer includes a GaSb layer in contact with the silicon substrate; and
   a compound semiconductor device layer on the buffer, wherein the buffer further includes an isolative semiconductor layer disposed between the GaSb layer and said compound semiconductor device layer.

2. The apparatus of claim 1, wherein the GaSb layer is on a (100) surface of the silicon substrate that is offcut 2 to 12 degrees in the direction.

3. The apparatus of claim 1, wherein the isolative semiconductor layer has a resistivity on the order of $1\times10^7$ ohm-cm.

4. The apparatus of claim 1, wherein the isolative semiconductor layer comprises AlSb.

5. The apparatus of claim 1, wherein the isolative semiconductor layer comprises $Al_xGa_{1-x}Sb$, wherein x is between approximately 0.1 and 1.0.

6. The apparatus of claim 1, wherein the compound semiconductor device layer comprises InSb.

7. The apparatus of claim 1, further comprising a device formed in the compound semiconductor device layer, wherein the device is selected from the group consisting of: an electronic device, an optical device, and an electro-optical device.

8. The apparatus of claim 7, wherein the electronic device formed in the compound semiconductor is a quantum well transistor.

9. An apparatus comprising:
   a silicon substrate;
   a buffer on the silicon substrate, wherein the buffer includes a GaSb layer disposed over the silicon substrate; and
   a compound semiconductor device layer disposed over the buffer, wherein the buffer further includes an isolative AlSb layer disposed between the GaSb layer and said compound semiconductor device layer, wherein the isolative AlSb layer has a resistivity on the order of $1\times10^7$ ohm-cm or greater.

10. The apparatus of claim 9, wherein the GaSb layer is on a (100) surface of the silicon substrate that is offcut 2 to 12 degrees in the direction.

11. The apparatus of claim 9, wherein the isolative AlSb layer further comprises Ga to form $Al_xGa_{1-x}Sb$, wherein x is between approximately 0.1 and 1.0.

12. The apparatus of claim 9, wherein the compound semiconductor device layer comprises InSb.

* * * * *

UNITED STATES PATENT AND TRADEMARK OFFICE
CERTIFICATE OF CORRECTION

| | |
|---|---|
| PATENT NO. | : 7,851,780 B2 |
| APPLICATION NO. | : 11/498685 |
| DATED | : December 14, 2010 |
| INVENTOR(S) | : Hudait et al. |

It is certified that error appears in the above-identified patent and that said Letters Patent is hereby corrected as shown below:

In column 14, at line 27 delete, "A1Sb" and insert -- AlSb --.

Signed and Sealed this
Fifth Day of July, 2011

David J. Kappos
*Director of the United States Patent and Trademark Office*